United States Patent
Beldi et al.

(10) Patent No.: US 9,302,816 B2
(45) Date of Patent: *Apr. 5, 2016

(54) POLYMER ARTICLE HAVING A THIN COATING FORMED ON AT LEAST ONE OF ITS SIDES BY PLASMA AND METHOD FOR PRODUCING SUCH AN ARTICLE

(71) Applicants: Nasser Beldi, Lannion (FR); Patrick Chollet, Lannion (FR)

(72) Inventors: Nasser Beldi, Lannion (FR); Patrick Chollet, Lannion (FR)

(73) Assignee: Innovative Systems & Technologies, Lannion (FR)

( * ) Notice: Subject to any disclaimer, the term of this patent is extended or adjusted under 35 U.S.C. 154(b) by 46 days.

This patent is subject to a terminal disclaimer.

(21) Appl. No.: 14/195,949

(22) Filed: Mar. 4, 2014

(65) Prior Publication Data

US 2014/0255676 A1    Sep. 11, 2014

Related U.S. Application Data

(62) Division of application No. 11/917,620, filed as application No. PCT/IB2006/002483 on Jun. 16, 2006, now Pat. No. 8,715,821.

(30) Foreign Application Priority Data

Jun. 16, 2005 (WO) .................. PCT/EP2005/007063

(51) Int. Cl.
*B65D 25/14* (2006.01)
*C23C 16/02* (2006.01)
*C23C 16/30* (2006.01)
*C23C 16/505* (2006.01)
*C23C 16/54* (2006.01)
*C23C 28/04* (2006.01)

(52) U.S. Cl.
CPC ............ *B65D 25/14* (2013.01); *C23C 16/0245* (2013.01); *C23C 16/30* (2013.01); *C23C 16/505* (2013.01); *C23C 16/54* (2013.01); *C23C 28/04* (2013.01); *Y10T 428/24975* (2015.01); *Y10T 428/265* (2015.01)

(58) Field of Classification Search
CPC ..................... C23C 16/0245; C23C 16/30505; C23C 28/04; Y10T 428/265; Y10T 428/24975
See application file for complete search history.

(56) References Cited

U.S. PATENT DOCUMENTS

2003/0215652 A1* 11/2003 O'Connor ..................... 428/451
2009/0042025 A1* 2/2009 Beldi et al. ................... 428/336

* cited by examiner

*Primary Examiner* — Karuna P Reddy
(74) *Attorney, Agent, or Firm* — Ladas & Parry LLP

(57) ABSTRACT

Polymer article having a thin coating on at least one of its side, the coating including a first coating of $SiO_xC_yH_z$ which is a plasma polymerized tetramethylsilane deposited on the surface on the polymer article, the x value being between 0 and 1.7, the y value being between 0.5 and 0.8, the z value being between 0.35 and 0.6 for the first $SiO_xC_yH_z$ coating and a second coating of $SiO_xC_yH_z$ which is a plasma polymerized tetramethylsilane deposited on the surface on the first coating, the x value being between 1.7 and 1.99, the y value being between 0.2 and 0.7, the z value being between 0.2 and 0.35 for the second $SiO_xC_yH_z$ coating and in that the thickness of the first coating is from about 1 nanometer to about 15 nanometers and in that the thickness of the second coating is from about 10 nanometers to about 100 nanometers.

9 Claims, 1 Drawing Sheet

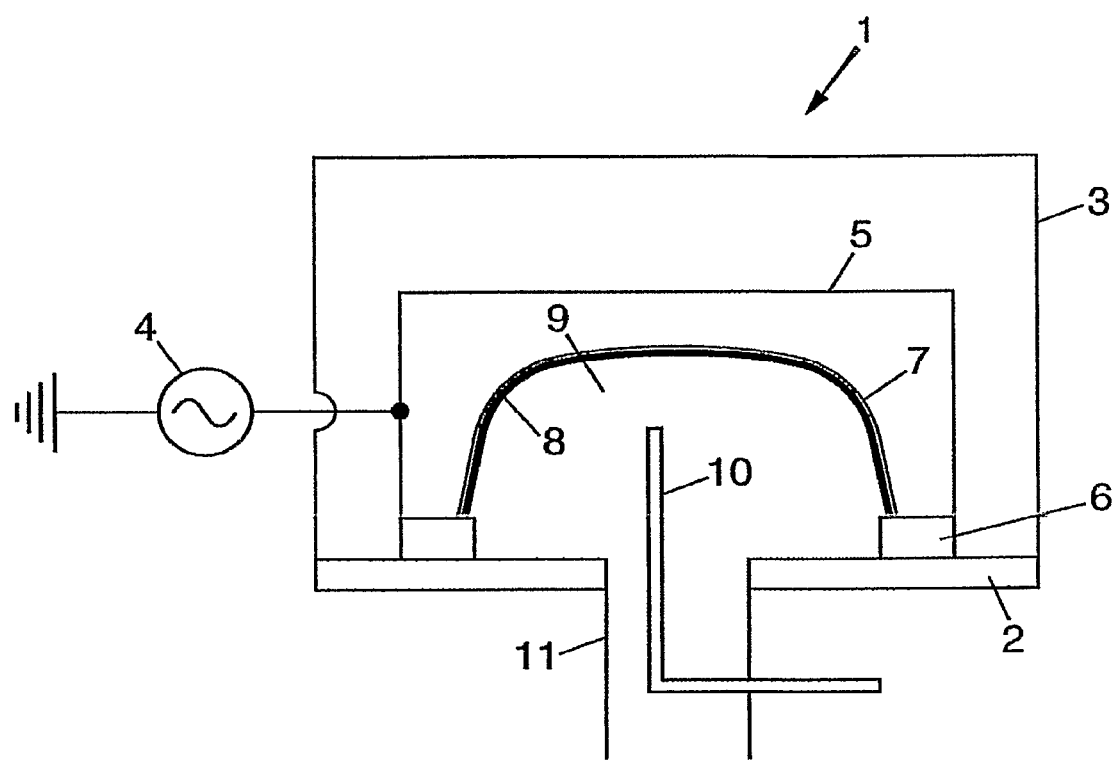

POLYMER ARTICLE HAVING A THIN COATING FORMED ON AT LEAST ONE OF ITS SIDES BY PLASMA AND METHOD FOR PRODUCING SUCH AN ARTICLE

The invention relates to a polymer article having a thin coating formed on at least one of its side by plasma and a method for manufacturing such an article.

The invention relates also to a polymer article manufactured by the method, this article being of any shape and obtained by injection, extrusion molding, blow molding, compression molding, vacuum forming and the like.

The invention relates more particularly to a method for manufacturing a polymer, preferentially either polypropylene or polyethylene, shaped article that is adapted to be used as a food container by having excellent surface properties such as reduced tendency of being stained, good resistance against chemicals, this container being washable in a dishwasher, and being also able to be placed either in a refrigerator, or in a freezer or a microwave oven.

A plasma treatment is a chemical process wherein a gaseous compound in a given volume is decomposed under reduced atmosphere by an electrical glow discharge resulting in the coating of a thin film on the walls of a container. In the hereunder specification, the term "thin film" means a film with a thickness less than a few hundreds of nanometers.

More precisely, Plasma Enhanced Chemical Vapor Deposition (hereinafter referred to as PECVD) is used for depositing a variety of thin films at lower temperature than those utilized in Chemical Vapor Deposition reactors.

PECVD uses electrical energy to generate a glow discharge in which the energy is transferred into a gas mixture. This transforms the gas mixture into reactive radicals, ions, neutral atoms and molecules and other exited species.

PECVD is largely used in electronics in depositing many films such as silicon nitride, diamond like carbon DLC, polysilicon, amorphous silicon, silicon oxynitride, silicon oxide, silicon dioxide.

Exemplarily, the document U.S. Pat. No. 3,485,666 describes a method of depositing a layer of silicon deposited upon a surface of a substrate by establishing a plasma adjacent to said surface in an atmosphere containing a gaseous hydride of silicon and a gaseous hydride of nitrogen. It is so obtained a silicon nitride layer which has application in providing a protective transparent surface coating on an article of a relatively soft and/or readily damaged material.

As it is well known, plastics used for containers permits low molecular gas, such as oxygen and carbon dioxide, to permeate there through, and furthermore, plastic sorbs inside therein low molecular inorganic compound. As a consequence, aroma component can be absorbed inside the plastic; oxygen can gradually oxidize the content of the container, deteriorating flavor, quality and purity of said content.

In a way to improve the impermeability of these kinds of containers, silicon oxide films deposited by plasma enhanced chemical vapor deposition received considerable attention in the packaging industry due to their excellent gas barrier performance and their transparency.

The document U.S. Pat. No. 3,442,686 discloses a flexible transparent packaging film which has extremely low permeability to gases and liquids, the film comprising, in combination, a flexible transparent organic polymeric base film, an adherent substantially gas and liquid impermeable intermediate coating of inorganic material on one surface of said base film and a sealable adherent top coating of organic polymeric material on said intermediate coating, said inorganic material being an oxide of silicon and said base film being polyester base film. So, as an oxide of silicon layer is transparent, it is also known to use oxide of silicon $SiO_x$ in order to improve the impermeability of polymeric films.

U.S. Pat. No. 5,691,007 discloses a PECVD process whereby a coating of inorganic material may be placed on 3-D articles in a closely spaced matrix. This inorganic material can be a metal oxide such as $SiO_x$ wherein x is from about 1.4 to about 2.5; or an aluminum oxide based composition. The silicon oxide based composition is substantially dense and vapor-impervious and is desirably derived from volatile organosilicon compounds and an oxidizer such as oxygen or nitrous oxide. Preferably, the thickness of the silicon oxide based material is about 50 to 400 nm. A flow of 2.6 standard cubic centimeters per minute (sccm) HMDSO (hexamethyldisiloxane) and 70 sccm oxygen is established and pressure regulated to 120 mTorr by pump throttling and a 3 min $SiO_x$ deposition is produced with an 11.9 MHz 120 watt RF excitation on PET tube.

U.S. Pat. No. 6,338,870 discloses the use of HMDSO or tetra methyl disiloxane TMDSO for deposition of $SiO_xC_y$ on PET laminated product wherein x is within the range of 1.5-2.2 and y is within the range of 0.15-0.80.

The document U.S. Pat. No. 4,830,873 discloses a process for applying a thin transparent layer onto the surface of plastic elements wherein the process comprises the steps of applying onto the surface of the plastic elements a monomeric vapor of organic compositions and forming a protective layer from an electrical gas discharge by means of a polymerization from the vapor phase with the assistance of radiation. In the example IV, during the glow polymerization of pure hexamethyl disiloxane (HMDS), a polymer film is generated on the plastic surface. Oxygen ($O_2$) is added into the glow discharge after the formation of a pure HMDS-glow polymer film of only a few 100 nanometers in order to increase the layer hardness. The addition of oxygen is performed with a delay with respect to the start of the polymerization process. It is so obtained a two-layer coating with a first layer formed during the glow polymerization of pure HMDS and a second layer formed during the glow polymerization of HMDS and oxygen. The second layer is then a $SiO_x$-like coating.

The document U.S. Pat. No. 5,718,967 also discloses a laminate comprising a) a plastic substrate having a surface, b) an adhesion promoter layer which is a first plasma polymerized organosilicon compound deposited on the surface of the substrate in the substantial absence of oxygen, the organosilicon compound being preferentially tetramethyldisiloxane, c) a protection coating layer which is a second plasma polymerized organosilicon compound deposited on the surface of the adhesion promoter layer in the presence of a sufficient stoichiometric excess of oxygen to form a silicon polymer of $SiO_{1.8-2.4}C_{0.3-1.0}H_{0.7-4.0}$. The organosilicon compound is preferentially tetramethyldisiloxane, d) an $SiO_x$ layer which is a layer of a plasma polymerized tetramethyldisiloxane deposited on the surface of the protective coating layer.

US 2003/0215652 discloses a polymeric substrate having a barrier coating comprising a polymeric substrate a first condensed plasma zone of $SiO_xC_yH_z$, wherein x is from 1 to 2.4, y is from 0.2 to 2.4 and z is from zero to 4 on the polymeric substrate wherein the plasma is generated from an organosilane compound in an oxidizing atmosphere and a further condensed plasma zone of $SiO_x$ on the polymeric substrate wherein the plasma is generated from an organosilane in a oxidizing atmosphere sufficient to form a $SiO_x$ layer.

The plasma-formed barrier is then a continuum of a plasma deposited coating having a composition which varies from $SiO_xC_yH_z$ at the interface between the plasma layer and the polymeric surface to $SiO_x$, which is the new surface of the container.

This substrate is used for polymer bottle, particularly the non refillable bottle used for carbonated beverages, the aim of the coating being to be a barrier to the permeation of odorants, flavorants, ingredients, gas and water vapor. It is contended that the condensed plasma coatings of this prior art document may be applied on any suitable substrate including polyolefin such as polypropylene or polyethylene. However, examples 1 to 7 in this prior art document are plasma coatings on PET, no information being given for examples 8a, 8b and 8c as regards the polymer used, a 150 microns HDPE film being mentioned in example 9, PET films being used in example 10, polycarbonate being used for the last examples 11 to 13.

According to the prior art the reacting gas used like HMDSO are liquids with a low vapor pressure at ambient temperature. The use of theses gases requires a carrying gas like argon to transport the vapor from the container towards the reacting chamber. In addition, it is necessary to heat the gas line to avoid the condensation of the gas between the container and the reacting chamber.

SUMMARY OF THE INVENTION

The present inventor have noticed that it remains particularly difficult to obtain $SiO_x$ or $SiO_xC_yH_z$ layers with good adhesion properties on some polymer substrate, especially polypropylene, using the PECVD route.

The present inventor has also noticed that the major part of patent literature on PECVD depositions for polymer substrate relates on PET (see e.g. EP 469 926, FR 2 812 568), the silicon oxide thin films on polypropylen obtained by prior art PECVD techniques (see example 4 of U.S. Pat. No. 5,378,510 or FR 2814382, FR 2670506, EP 787828) not being able to produce washable containers having reduced tendency of being stained.

More precisely, according to the prior art layers, like in U.S. Pat. No. 4,830,873 or U.S. Pat. No. 5,718,967, it is not obtained a wash resistant, protective, transparent layer.

In fact, the applicant has noticed that an external either $SiO_x$-like or $SiO_x$ coating shows a bad resistance in a dishwasher and does not show good anti-staining properties after several washes in a dishwasher, especially at higher temperatures.

Furthermore, according to the document U.S. Pat. No. 5,718,967, the adhesion promoter layer has a thickness of about 100 nm to about 200 nm and the protective coating layer has a thickness of not less than about 0.1 micron and not greater than about 2 microns.

In order to improve the transparency feature of the laminate, and to obtain wash-resistant layers with a reduced tendency of being stained, it would be preferable to have layers with a thickness as reduced as possible.

In fact, the thicker the layer is, the less flexible it is, and the more breakable it is, especially after several washes in a dishwasher.

An object of the present invention is to provide a coating for a polymer article and a method for manufacturing a polymer article having a coating according to the present invention.

Another object of the invention is to provide a polymer article with a coating having a reduced tendency of being stained, i.e. an article which has reduced tendency of being stained when contacted with either food or liquid, and more precisely when contacted with coffee, tea, carrots, and tomatoes sauce.

Another object of the invention is to provide a polymer article with a coating according to the present invention which is not washed out in a dishwasher, i.e. which is wash-resistant.

An object of the invention is to provide a coating with a good steam-resistance

Another object of the invention is to provide a coating with a good adhesion on a polymer substrate with no detachment.

Another object of the invention is to provide a polymer article which remains transparent after several washes in a dishwasher.

Another object of the present invention is to provide a polymer article incorporating a coating with a reduced wall thickness while maintaining a suitable barrier to the permeation of odorants, flavorants, ingredients, gas and water vapor.

Another object of the present invention is a method for manufacturing a polymer article having a thin coating formed on at least one of its side by plasma, this article being able to be placed either in a refrigerator or in a freezer or in a microwave oven.

An object of the invention is to provide a reacting gas which is stable and does not react in contact with oxygen.

An object of the invention is to provide a reacting gas which is at a sufficient saturation vapor pressure in order to be moved from a storage place to a reacting chamber without adding a carrier gas.

An object of the invention is to provide a reacting gas which does not need to be heated during its moving from a storage place to a reacting chamber in order to avoid the condensation of said reacting gas.

An object of the invention is to provide a reacting gas with no spontaneous combustion.

An object of the invention is to provide a coating with a better control of the oxygen percentage in the coating.

An object of the invention is a polymer article having a thin coating on at least one of its side, characterized in that said coating comprises a first coating of $SiO_xC_yH_z$ which is either a plasma polymerized tetramethylsilane or a plasma polymerized tetramethylsilane and an oxidizing gas, preferentially oxygen or carbon dioxide, deposited on the surface on said polymer article, the x value being between 0 and 1.7, the y value being between 0.5 and 0.8, the z value being between 0.35 and 0.6 for said first $SiO_xC_yH_z$ coating and a second coating of $SiO_xC_yH_z$ which is a plasma polymerized tetramethylsilane and an oxidizing gas, preferentially oxygen or carbon dioxide, deposited on the surface on said first coating, the x value being between 1.7 and 1.99, the y value being between 0.2 and 0.7, the z value being between 0.2 and 0.35 for said second $SiO_xC_yH_z$ coating and in that the thickness of said first coating is from about 1 nanometer to about 15 nanometers and in that the thickness of said second coating is from about 10 nanometers to about 100 nanometers, preferentially around 30 nanometers.

The method according to the invention for manufacturing a polymer article having a thin coating formed on at least one of its side by plasma, characterized in that said method comprises successively:
- a plasma treatment on said polymer article, advantageously an argon plasma treatment;
- a deposition of a first coating of $SiO_xC_yH_z$ by generation of a plasma either from tetramethylsilane, or from tetramethylsilane and an oxidizing gas, preferentially oxygen or carbon dioxide, the x value being between 0 and 1.7, the y value being between 0.5 and 0.8, the z value being between 0.35 and 0.6 for said first $SiO_xC_yH_z$ coating, and a subsequent deposition of a second coating of $SiO_xC_yH_z$ by generation of a plasma from tetramethylsilane in the presence of an oxidizing gas, preferentially oxygen $O_2$ or carbon dioxide $CO_2$, the x value being between 1.7 and 1.99, the y value being between 0.2 and 0.7, the z value being between 0.2 and 0.35 for said second $SiO_xC_yH_z$ coating, the thickness of said first coating being from about 1 nanometer to about 15 nanometers and the thickness of said second coating being from about 10 nanometers to about 100 nanometers, preferentially around 30 nanometers.

According to the invention, it is obtained a coating which the features here above mentioned, i.e. reduced tendency to being stained, steam-resistance, transparency, reduced thickness.

Furthermore, the oxygen percentage in the coating is easily controlled as the tetramethylsilane does not contain any oxygen element. So the oxygen percentage in the coating layer is only controlled by the flow of the oxidizing gas.

Moreover, the tetramethylsilane is usable as such, i.e. without adding a carrier gas between a storage place to the reacting chamber.

In one embodiment, the polymer article is configured in the form of a container, its inner side being plasma treated and coated.

Advantageously, the polymer article is made in polypropylene or polyethylene.

Preferentially, the coating is made using either magnetic guidance, or a plasma generating electrode, or both magnetic guidance and a plasma generating electrode.

In one embodiment, power is loaded to the plasma using a frequency of 13.56 MHz.

The ratio between oxygen and tetramethylsilane is between around zero and four so as to obtain said first coating, said ratio being between around four and ten so as to obtain said second coating onto said first one.

In one aspect of the invention, the ratio between oxygen and tetramethylsilane is maintained during a first step of around one to four seconds at its first value of around zero to four, said ratio being maintained during a second step of around five to thirty seconds at its second value of around four to ten.

DESCRIPTION OF PREFERRED EMBODIMENT

A preferred embodiment of the invention will now be described with reference to the accompanying drawing, in which:

FIG. 1 shows apparatus for producing layers on an article.

In one embodiment, a 3D polypropylene container of the type used for food is placed in a vacuum chamber thus defining an internal volume, the internal volume forming the reaction chamber for the plasma treatment. The term "plasma treatment" means the chemical decomposition of a gaseous compound by an electrical glow discharge under reduced atmosphere. Through a plasma treatment, it is obtained a layer or coating over the internal walls of the container in which the pressure has been reduced and the electrical glow discharge has taken place.

The apparatus 1 for producing the coating according the invention comprises a support plate 2 overcoated by a radiofrequency faraday shield 3 having a radiofrequency electrode 5 supported by isolation means 6 provided on the support plate 2. The electrode 5 is connected to a radiofrequencies generator 4, known as such.

The electrode 5 has an internal shaped wall 7 on which the article to be coated 8 is placed. Advantageously, the internal shaped wall 7 has a complementary form of the form of article 8.

The article to be coated 8 forms an internal volume 9 which is the reacting chamber in which gas from an inlet 10 is injected.

Pumping means are also provided in order to reduce the pressure inside the internal volume through an aperture 11 in the support plate 2.

Pressure is gradually reduced inside the reaction chamber 9 to a value of around 0.01 mbar. Reaction gases are then introduced through the gas inlet 10 in the reaction chamber 9 until a pressure of about 0.1 mbar.

Then an electrical glow discharge is applied through the electrode 5 disposed around the container closely to its external surface so that the plasma is generated only on the inner surface of the container 8.

First of all, argon plasma treatment is made on the inner surface of the 3D container. Preferentially, the argon plasma treatment is between 1 and 20 s, more preferentially between 5 and 10 s.

The argon plasma treatment increases the energy on the surface in order to obtain a better adherence on it of a plasma deposition.

Then a first plasma deposit is made on the plasma treated inner surface of the container, using tetramethylsilane Si—$(CH_3)_4$ and oxygen $O_2$ both injected at a given flow rate in said internal volume of the container forming the reaction chamber. Preferentially, power is loaded to the plasma by radiofrequency, the frequency being of 13.56 MHz. The ratio between oxygen and tetramethylsilane is between zero and three in the vacuum chamber and the treatment time is between one to four seconds.

The tetramethylsilane has a saturation vapor pressure of around 900 mbar at ambient temperature and does not need to be added in a carrier gas in order to be moved from a storage place to the reacting chamber 9.

Furthermore, it is not necessary to heat the gas during the process according to the invention, and more precisely during the moving between the storage place of the gas and the reacting chamber in order to avoid the condensation of the gas.

The first deposit is a first $SiO_xC_yH_z$ layer (or coating) of a few nanometers thick, the thickness of said first $SiO_xC_yH_z$ coating is from about 0.1 nanometer to about 15 nanometers.

Using a ratio of around two between oxygen and tetramethylsilane in said internal volume of the container forming the reaction chamber, i.e. using an oxygen flow rate twice as big as the tetramethylsilane flow rate, the chemical composition of this first $SiO_xC_yH_z$ coating is the following:

Si: 27.6%
O: 43.6%
C: 17.1%
H: 11.7%

Formula $SiO_xC_yH_z$ x being 1.58, y being 0.62 and z being 0.42.

In order to determine the chemical composition of first and second coatings, Electron Spectroscopy for Chemical Analysis (ESCA), Infrared Transmission (FTIR) and Electron Recoil Detection (ERD) analyses have been used.

A second plasma deposit is then made on the coated inner surface of the container, using tetramethylsilane and oxygen again. Power is again loaded by RF, same frequency being used. The ratio between oxygen and tetramethylsilane in said internal volume of the container forming the reaction chamber is maintained between four and ten, i.e. the oxygen flow rate in said internal volume is between four and ten times bigger than the tetramethylsilane flow rate in said internal volume and the treatment time is between five to thirty seconds. Preferentially, the ratio between oxygen and tetramethylsilane is between four and seven.

To summarize, the ratio between oxygen and tetramethylsilane is between around zero and three so as to obtain said first coating and the ratio is between around four and ten so as to obtain said second coating onto said first one.

The second deposit is a $SiO_xC_yH_z$ layer (or coating) of a few nanometers thick. More precisely, the thickness of said second $SiO_xC_yH_z$ coating is from about 10 nanometers to about 100 nanometers, preferentially from 15 to 50 nanometers, and more preferentially around 30 nanometers.

Using a ratio of around 4.5 between oxygen and tetramethylsilane in said internal volume of the container forming the reaction chamber, the chemical composition of this second $SiO_xC_yH_z$ coating is the following (ESCA, FTIR and ERD analyses):

Si: 28.5%
O: 50.55%
C: 12.55%
H: 8.35%
Formula $SiO_xC_yH_z$ x being 1.77, y being 0.44 and z being 0.29

Using a ratio of around 8.5 between oxygen and TMS, the chemical composition of this second $SiO_xC_yH_z$ coating is the following (ESCA, FTIR and ERD analyses):

Si: 28.75%
O: 54.95%
C: 8.9%
H: 7.4%
Formula $SiO_xC_yH_z$ x being 1.91, y being 0.31 and z being 0.257.

After the second deposit of the second $SiO_xC_yH_z$ coating, the reduced atmosphere is increased to the ambient atmosphere.

The present inventor has surprisingly discovered that the shaped article obtained has a very low tendency of being stained during its lifetime, this shaped article being washable in a dishwasher, and being also able to be placed in a refrigerator, a freezer or a microwave oven.

A number of 125 washings were made at 85° C. using a detergent named Neodisher Alka 300 and a rinsing liquid agent named Neodisher T S, supplied by Dr Weigert Cie.

In order to verify the anti-staining feature of the coating according to the present invention, bowls have been filled with different kind of aggressive alimentary sauces and coloring products and then stocked in an oven at 80° C. during 24 hours.

The tendency of being stained was visually observed before and after dishwashing.

Very good results were obtained with the containers treated by the above described method, i.e. it has been visually noticed that the bowls with a coating according the invention are not stained by comparison with any other bowl.

The applicant has also noticed that after dishwashing the surface of the coating becomes very hydrophilic.

The applicant has also noticed that a too high ratio between oxygen and tetramethylsilane involves the formation of a $SiO_x$-like coating, which is not wash-resistant after several washes in a dishwasher, especially at higher temperatures.

The method for manufacturing a polymer article having a thin coating formed on at least one of its side by plasma according to the present invention comprises successively:
  a plasma treatment on said polymer article, advantageously an argon plasma treatment;
  a deposition of a first coating of $SiO_xC_yH_z$ by generation of a plasma from tetramethylsilane, preferentially in the presence of an oxidizing gas, preferentially oxygen $O_2$ or carbon dioxyde, the x value being between 0 and 1.7, the y value being between 0.5 and 0.8, the z value being between 0.35 and 0.6 for said first $SiO_xC_yH_z$ coating, and
  a subsequent deposition of a second coating of $SiO_xC_yH_z$ by generation of a plasma from tetramethylsilane in the presence of an oxidizing gas, preferentially oxygen $O_2$ or carbon dioxide, the x value being between 1.7 and 1.99, the y value being between 0.2 and 0.7, the z value being between 0.2 and 0.35 for said second $SiO_xC_yH_z$ coating, the thickness of said first coating being from about 1 nanometer to about 15 nanometers and the thickness of said second coating being from about 10 nanometers to about 100 nanometers, preferentially around 30 nanometers.

Preferentially, the polymer article is configured in the form of a container, its inner side being plasma treated and coated.

Furthermore, when the polymer article is an article having an internal volume, the method according the invention comprises before said step of plasma treatment on said polymer article, the following steps of:
  placing a polymer article in a vacuum chamber;
  decreasing the pressure in the vacuum chamber;
  decreasing the pressure in the internal volume of the polymer article;
  applying an electrical glow discharge through an electrode disposed around the container closely to its external surface.

The applicant has surprisingly discovered that a first coating of $SiO_xC_yH_z$ which is either a plasma polymerized tetramethylsilane or a plasma polymerized tetramethylsilane and an oxidizing gas, preferentially oxygen or carbon dioxide, deposited on the surface on a polymer article, with an x value between 0 and 1.7, an y value between 0.5 and 0.8, and an z value between 0.35 and 0.6 for said first $SiO_xC_yH_z$ coating is highly preferential and that a second coating of $SiO_xC_yH_z$ which is a plasma polymerized tetramethylsilane and an oxidizing gas, preferentially oxygen or carbon dioxide, deposited on the surface on the first coating, with an x value between 1.7 and 1.99, an y value between 0.2 and 0.7, and an z value between 0.2 and 0.35 for said second $SiO_xC_yH_z$ coating is highly preferential.

The polymer article may be in either polypropylene or polyethylene or polycarbonate or poly butyl teraphtalate.

The coating according to the invention may be made using either magnetic guidance, or a plasma generating electrode, or both magnetic guidance and a plasma generating electrode.

Preferentially, the polymer article is a 3D shaped one, this article being placed in a vacuum chamber and defining an internal volume and an external volume, the inner part of the article defining the internal volume as the reacting chamber, pressure inside said reacting chamber being around 0.01 mbar.

The applicant has also noticed that that a method with an argon plasma treatment made on the inner surface of a 3D polyethylene container and a plasma deposition of one coating made on the inner surface using tetramethysilane and oxygen also results in the formation of a container having very low tendency of being stained during its lifetime and being washable in a dishwasher and able to be placed in a refrigerator, a freezer or a microwave oven.

The ratio between oxygen and tetramethylsilane in the internal volume of the container forming the reaction chamber is maintained between four and ten, i.e. the oxygen flow rate in said internal volume is between four and ten times bigger than the tetramethylsilane flow rate in said internal volume and the treatment time is between five to thirty seconds. Preferentially, the ratio between oxygen and tetramethylsilane is between four and seven.

The layer is a $SiO_xC_yH_z$ layer (or coating) of a few nanometers thick. More precisely, the thickness of said $SiO_xC_yH_z$ coating is from about 10 nanometers to about 100 nanometers, preferentially from 15 to 50 nanometers, and more preferentially around 30 nanometers.

Nevertheless, a method with a first $SiO_xC_yH_z$ coating and a second $SiO_xC_yH_z$ coating is highly preferential and results in a polymer article with improved features (wash resistance, transparency, etc.).

The invention claimed is:

1. A polymer article comprising:
    a thin coating on at least one side of said article;
    a polymer material defining a supporting surface of the polymer article;
    wherein said thin coating directly covers the supporting surface;
    wherein said thin coating comprises a first coating of $SiO_xC_yH_z$ directly coated on the supporting surface, and an outer coating of $SiO_xC_yH_z$, the outer coating being a second coating different from the first coating, and the outer coating of $SiO_xC_yH_z$ defining an outer surface of the polymer article is directly coated on the first coating of $SiO_xC_yH_z$, the outer coating of $SiO_xC_yH_z$ being a plasma polymerized tetramethylsilane and an oxidizing gas, wherein x is between 1.7 and 1.99, y is between 0.2 and 0.7, and z is between 0.2 and 0.35, for said outer $SiO_xC_yH_z$ coating;
    wherein x is between 0 and 1.7, y is between 0.5 and 0.8, and z is between 0.35 and 0.6 for said first $SiO_xC_yH_z$ coating, the first coating and the second coating defining said thin coating; and
    wherein the thickness of said outer coating is from about 10 nanometers to about 100 nanometers.

2. The polymer article of claim 1, wherein the polymer material is selected from the group consisting of polypropylene, polyethylene, polycarbonate, and poly butyl teraphtalate.

3. The polymer article of claim 1, wherein the first coating of $SiO_xC_yH_z$ is either a plasma polymerized tetramethylsilane or a plasma polymerized tetramethylsilane and an oxidizing gas, deposited on the supporting surface on said polymer article, and wherein the second coating of $SiO_xC_yH_z$ is deposited on the surface on said first coating.

4. The polymer article of claim 3, wherein a thickness of the first coating is from about 1 nanometer to about 15 nanometers.

5. The polymer article of claim 1, wherein a thickness of the first coating is from about 1 nanometer to about 15 nanometers.

6. The polymer article of claim 1, wherein a thickness of the outer coating is from 15 nanometers to 50 nanometers.

7. The polymer article of claim 1, wherein a thickness of the outer coating is 30 nanometers.

8. The polymer article of claim 1, wherein a value of x for said first $SiO_xC_yH_z$ coating is less than a value of x for said second $SiO_xC_yH_z$ coating, and a value of z for said first $SiO_xC_yH_z$ coating is greater than a value of z for said second $SiO_xC_yH_z$ coating.

9. The polymer article of claim 1, wherein the supporting surface is an inner surface of a three-dimensional container.

* * * * *